(12) United States Patent
Botiov

(10) Patent No.: US 12,432,866 B2
(45) Date of Patent: Sep. 30, 2025

(54) CONTROL UNIT HAVING A CONTACTING CONCEPT FOR A GROUND CONNECTION

(71) Applicant: Schaeffler Technologies AG & Co. KG, Herzogenaurach (DE)

(72) Inventor: Julian Botiov, Bühl (DE)

(73) Assignee: Schaeffler Technologies AG & Co. KG, Herzogenaurach (DE)

( * ) Notice: Subject to any disclaimer, the term of this patent is extended or adjusted under 35 U.S.C. 154(b) by 303 days.

(21) Appl. No.: 18/024,118

(22) PCT Filed: Aug. 6, 2021

(86) PCT No.: PCT/DE2021/100677
§ 371 (c)(1),
(2) Date: Mar. 1, 2023

(87) PCT Pub. No.: WO2022/053100
PCT Pub. Date: Mar. 17, 2022

(65) Prior Publication Data
US 2023/0276582 A1    Aug. 31, 2023

(30) Foreign Application Priority Data

Sep. 14, 2020   (DE) .......................... 102020123816.9

(51) Int. Cl.
*H05K 5/02*        (2006.01)
*B60R 16/02*       (2006.01)
(Continued)

(52) U.S. Cl.
CPC ......... *H05K 5/0217* (2013.01); *H05K 7/1427* (2013.01)

(58) Field of Classification Search
CPC ..... B60R 16/02; B60R 16/06; B60R 16/0239; H05K 7/1427; H05K 5/0217
See application file for complete search history.

(56) References Cited

U.S. PATENT DOCUMENTS

2003/0048192 A1   3/2003   Clark
2006/0283630 A1   12/2006  Kiiskinen et al.
(Continued)

FOREIGN PATENT DOCUMENTS

CN    104955290 A    9/2015
GB       235221 A    3/1926
(Continued)

*Primary Examiner* — Timothy J Thompson
*Assistant Examiner* — Amol H Patel
(74) *Attorney, Agent, or Firm* — Volpe Koenig

(57) ABSTRACT

A control unit for a motor vehicle, including a housing and at least one electronic component accommodated in the housing. The housing is provided with at least one screw-receiving hole for receiving a mounting screw, and a bridging element consisting of metal and used for a ground connection of the at least one electronic component is also present, which bridging element, via a first end region which is located inside the housing, is electrically connected to the electronic component and, via a second end region which can be resiliently deformed along the screw-receiving hole, is arranged in a support region intended for axial support of a screw head of the mounting screw. A drive module with this control unit is also provided.

18 Claims, 7 Drawing Sheets

(51) Int. Cl.
*B60R 16/023* (2006.01)
*B60R 16/06* (2006.01)
*H05K 7/14* (2006.01)

(56) References Cited

U.S. PATENT DOCUMENTS

| | | | |
|---|---|---|---|
| 2008/0035363 A1 | 2/2008 | Yan | |
| 2014/0285986 A1* | 9/2014 | Sano | H05K 9/0064 |
| | | | 361/752 |
| 2017/0197565 A1* | 7/2017 | Yoneyama | B60R 16/0238 |
| 2017/0305370 A1 | 10/2017 | Yamashita | |
| 2020/0112108 A1* | 4/2020 | Yoshida | H05K 1/0215 |
| 2020/0136360 A1* | 4/2020 | Yoshida | H05K 9/0064 |
| 2021/0028673 A1* | 1/2021 | Kim | H02K 11/30 |

FOREIGN PATENT DOCUMENTS

| | | |
|---|---|---|
| JP | 2003031194 A | 1/2003 |
| JP | 2012121472 A | 6/2012 |

* cited by examiner

CONTROL UNIT HAVING A CONTACTING CONCEPT FOR A GROUND CONNECTION

CROSS-REFERENCE TO RELATED APPLICATIONS

This application is the U.S. National Phase of PCT Appln. No. PCT/DE2021/100677, filed Aug. 6, 2021, which claims the benefit of German Patent Appln. No. 102020123816.9, filed Sep. 14, 2020, the entire disclosures of which are incorporated by reference herein.

TECHNICAL FIELD

The disclosure relates to a control unit for a motor vehicle, preferably a control unit for controlling an actuator. In addition, the v relates to a drive module for a parking lock actuation of a motor vehicle having this control unit.

BACKGROUND

In the case of smaller-dimensioned control units (up to about 5 W constant power and up to about 50 W short-term power), which are used, for example, to actuate actuators in a motor vehicle drive train, it has been found that their housings can in principle also be made of a non-conductive material, such as a plastic, and not be equipped with a separate heat sink/heat bridge, since the waste heat generated during operation is relatively low. The resulting waste heat is then simply released into the environment. For these smaller control units, it is nevertheless necessary to provide a sufficient ground connection to safely connect their electronic components to a vehicle ground.

SUMMARY

It is therefore the object of the disclosure to provide a control unit, the structure of which is kept as simple as possible and which can be produced with a low production effort, but which at the same time ensures a reliable electrical connection of its electronic components when mounted on the vehicle.

This is achieved with a control unit for a motor vehicle, such as a passenger car, truck, bus or other commercial vehicle, which has one or more of the features disclosed herein. The control unit is equipped with a housing and at least one electronic component accommodated in the housing. The housing is further provided with at least one screw-receiving hole for receiving a mounting screw. In addition, a bridging element consisting of (electrically conductive) metal and used for a ground connection of the at least one electronic component is also present, which bridging element, via a first end region which is located inside the housing, is electrically connected to the electronic component and, via a second end region which can be resiliently deformed along the screw-receiving hole, is arranged in a support region intended for axial support of a screw head of the mounting screw.

This bridging element enables simple and direct connection of the corresponding electronic components of the control unit to a vehicle ground via a mounting screw. The resilient design of the second end region ensures that this ground connection is robust over as long of an operating life as possible.

Further advantageous embodiments are explained in more detail below.

The housing is preferably (at least partially) made of an electrically non-conductive/non-conducting material, particularly preferably a plastic. The bridging element thus advantageously penetrates the housing consisting of the non-conducting material/plastic. This allows the housing to be produced as efficiently as possible.

If the bridging element is fixed in the housing by injection molding and/or by means of a mechanical fixing element, precise positioning of the bridging element and thus a reliable ground connection is achieved.

In addition, it is expedient if the screw-receiving hole is formed/enclosed by a metallic support sleeve fixedly accommodated in the housing and the bridging element is arranged in such a way that the second end region projects axially beyond the support sleeve. This ensures that the mounting screw bears securely and sufficiently tightly against the bridging element in the mounted state.

For further simplified production, it has also proved advantageous if the second end region is provided with an elongated hole extending transversely to a longitudinal direction of the screw-receiving hole. In principle, the elongated hole can be open on one side or closed in the transverse direction. This allows the spring elasticity of the bridging element to be easily adjusted as required.

In this context, it has also been found to be advantageous if the second end region is designed to be eye-shaped, hook-shaped or S-shaped. Such geometries, which ensure spring elasticity, can be produced as simply as possible, preferably by means of a punching process.

If the bridging element is formed from a metal sheet with a uniform sheet thickness, production is further simplified.

If the second end region is designed in such a way that it can be further resiliently compressed when the screw head is supported in a planar manner on the support region, the ground connection is ensured even if the position of the mounting screw changes during operation.

If the electronic component is designed as a printed circuit board or is arranged on this printed circuit board, the entire printed circuit board is also directly connected to a ground of the motor vehicle.

Furthermore, the disclosure relates to a drive module for a parking lock actuation of a motor vehicle, having a control unit according to the disclosure according to at least one of the embodiments described above and an electric motor connected to the control unit. The electric motor is again preferably coupled to a corresponding actuator, preferably a mechanical actuator.

If the electric motor and the control unit are arranged in a common housing, the structure of the connection unit is further simplified.

In other words, a contacting concept according to the disclosure is thus implemented for a ground connection in a compact control unit (controlling unit) with a plastic housing. This unit is preferably an integrated control unit, for example in an integrated parking lock actuator. In this regard, a corresponding ground pin is proposed, which connects the mounting screw of the housing with a conductive part of the printed circuit board (PCB). For this purpose, the ground pin has a PCB contact point (first end region) with a press-in zone and a screw contact point with an elastically deformable zone (second end region). In addition, a sealing concept is present that interacts with this.

BRIEF DESCRIPTION OF THE DRAWINGS

The disclosure will now be explained in more detail with reference to figures, in which connection various exemplary embodiments are also shown.

In the figures.

DETAILED DESCRIPTION

The figures are only schematic in nature and serve only for understanding the disclosure. The same elements are provided with the same reference symbols.

Figure 4:
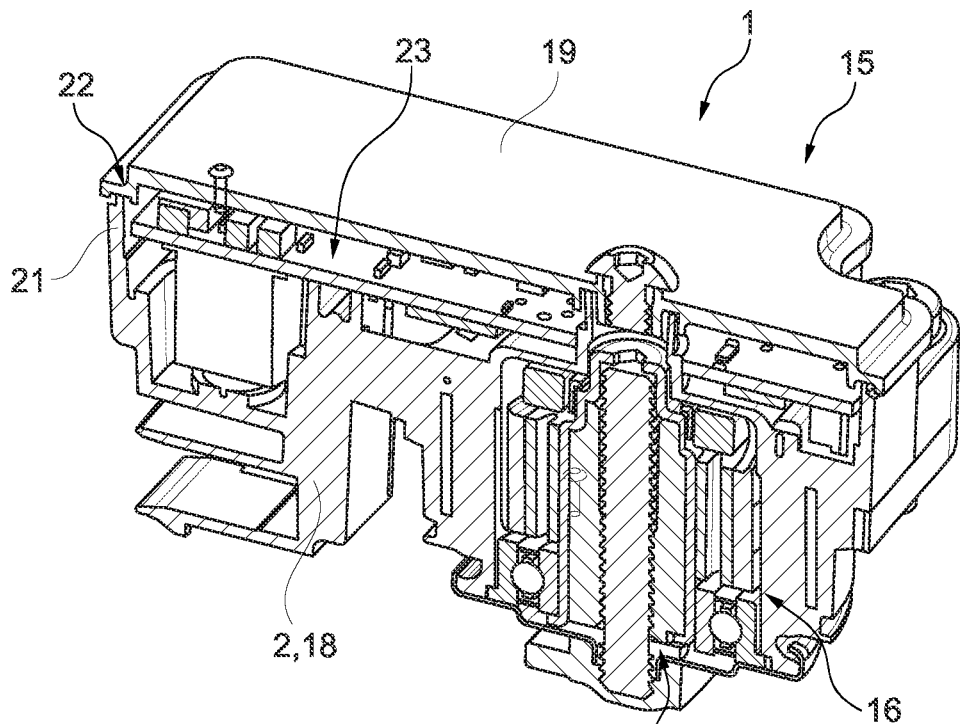
FIG. 4 shows a perspective view of the control unit according to FIG. 1 in a sectioned state, wherein the cover of the housing is also shown in contrast to FIG. 1 and a more detailed structure of an electric motor likewise accommodated in the housing is illustrated.
Figure 5:
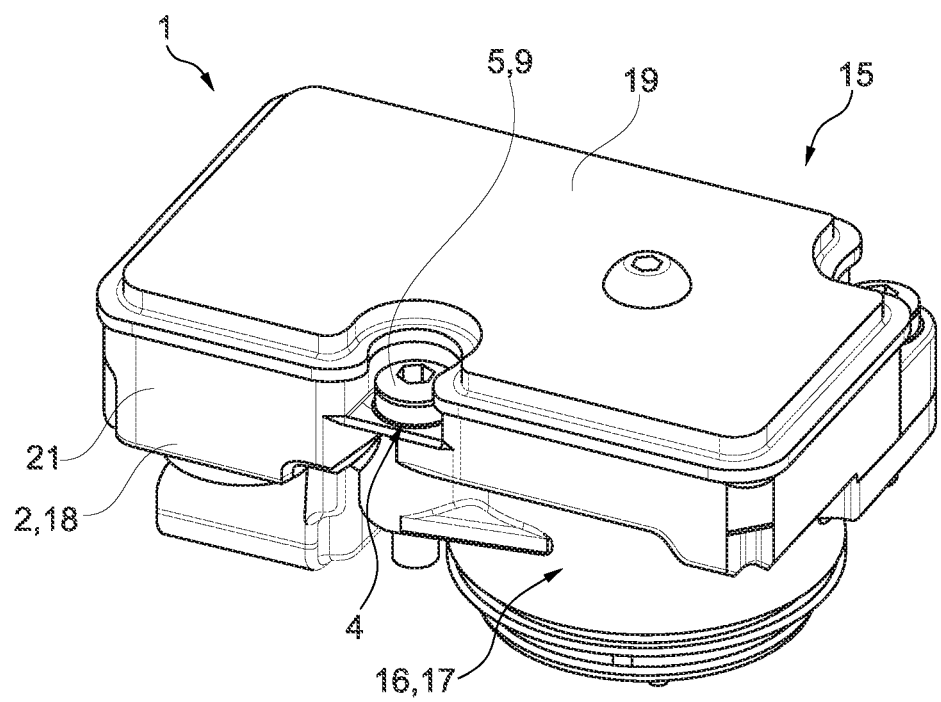
FIG. 5 shows a perspective view of the control unit according to FIG. 4 in a full view.
Figure 6:
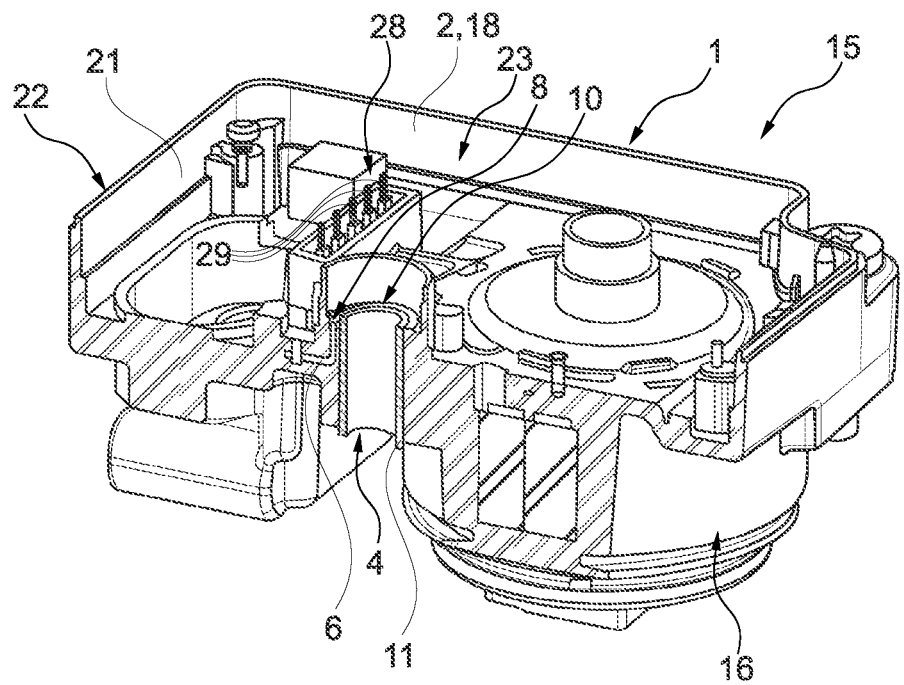
FIG. 6 shows a perspective view of the control unit, similar to FIG. 2, wherein the control unit is sectioned in such a way that the course of the bridging element within the housing is visible.

In FIGS. 1, 2 and 4 to 6, an overall structure of a control unit 1 according to the disclosure can be seen according to a preferred exemplary embodiment. In this embodiment, the control unit 1 is directly integrated into a drive module 15 or the control unit 1 directly forms the drive module 15. The control unit 1 forms a control electronics unit for an electric motor 16 of the drive module 15 and is consequently electrically connected to it. The electric motor 16, as shown in FIG. 4, is accommodated in a common housing 2 together with the control unit 1. The electric motor 16 further interacts with a spindle drive 20, which spindle drive 20 directly forms a mechanical actuator 17 of the drive module 15. This actuator 17 can be used to control/actuate further components in a motor vehicle drive train during operation. In this embodiment, it is a drive module 15 for a parking lock/parking lock actuator to consequently engage or disengage a parking lock of the motor vehicle. The drive module 15 is thus designed as a parking lock actuator. In further embodiments, the control unit 1/drive module 15 is used to actuate other components.

The housing 2 of the control unit 1 is made of plastic. The housing 2 essentially has two parts: A trough-shaped main part 18 and a cover 19 mounted on the main part 18. The cover 19 is accommodated on the main part 18 in such a way that an interior 23 of the housing 2 is hermetically sealed off from the environment 24.

Various electronic components 3 are present in the interior 23, which are placed on a printed circuit board 14/PCB, forming the control electronics unit for the electric motor 16. In an overall consideration of FIGS. 1 and 4, it can further be seen that the main part 18 has a completely circumferential receiving contour 22 towards its side/end face facing the cover 19, which is formed by an outer wall 21. The receiving contour 22 extends in a plane.

In this embodiment, the cover 19 is supported on the outer wall 21/main part 18 via a separately provided seal (solid seal), which is not shown in detail for reasons of clarity. In further embodiments, another seal, such as an adhesive seal, is also provided or a material connection (preferably as a laser welded connection) of the cover 19 to the main part 18 is implemented. Both the cover 19 and the main part 18 are molded/made of a plastic.

According to the disclosure, a bridging element 6 is now provided for ground connection of the printed circuit board 14 and thus of the individual electronic components 3 as arranged on the printed circuit board 14.

Figure 1:
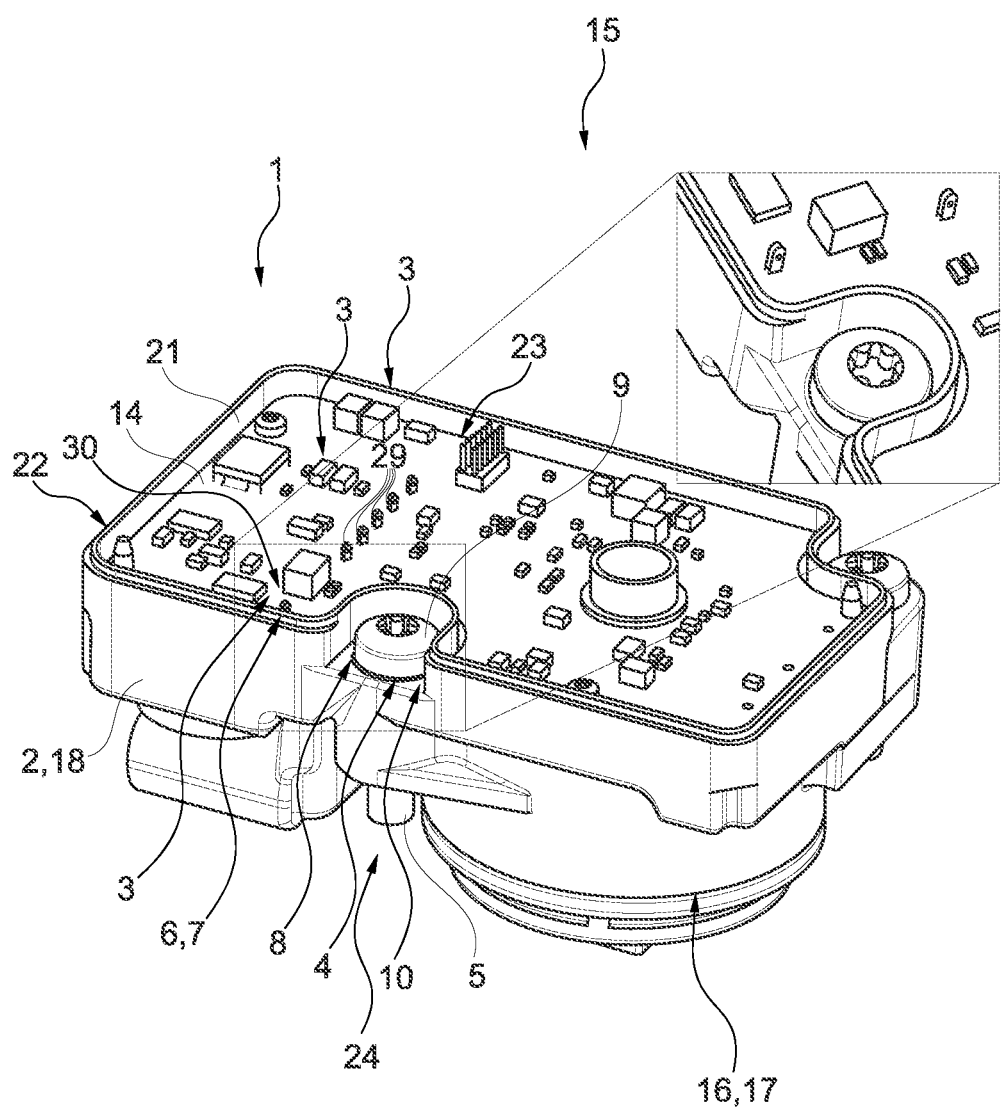
FIG. 1 shows a perspective view of a control unit according to the disclosure according to a preferred exemplary embodiment, wherein a cover of a housing of the control unit is hidden so that a printed circuit board mounted therein with electronic components as well as their coupling in principle with a bridging element extending towards a mounting screw arranged in a receiving hole can be seen.
Figure 2:
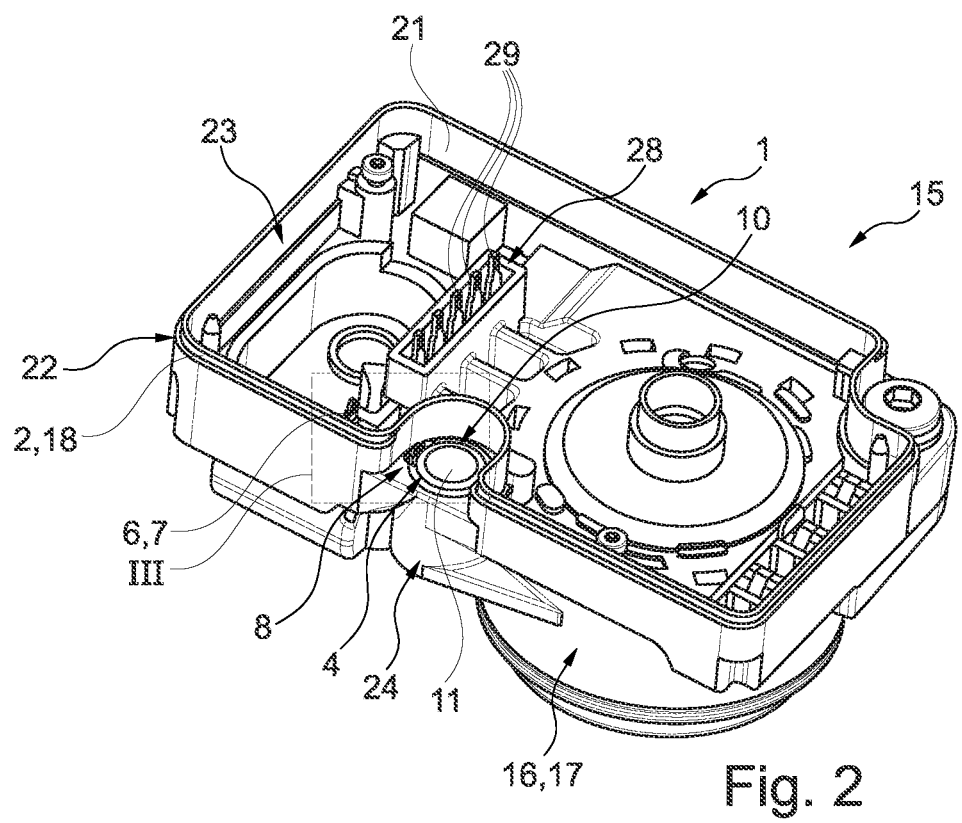
FIG. 2 shows a perspective view of the control unit, similar to FIG. 1, wherein the printed circuit board and the mounting screw are now also hidden so that the bridging element can be seen more clearly.
Figure 3:
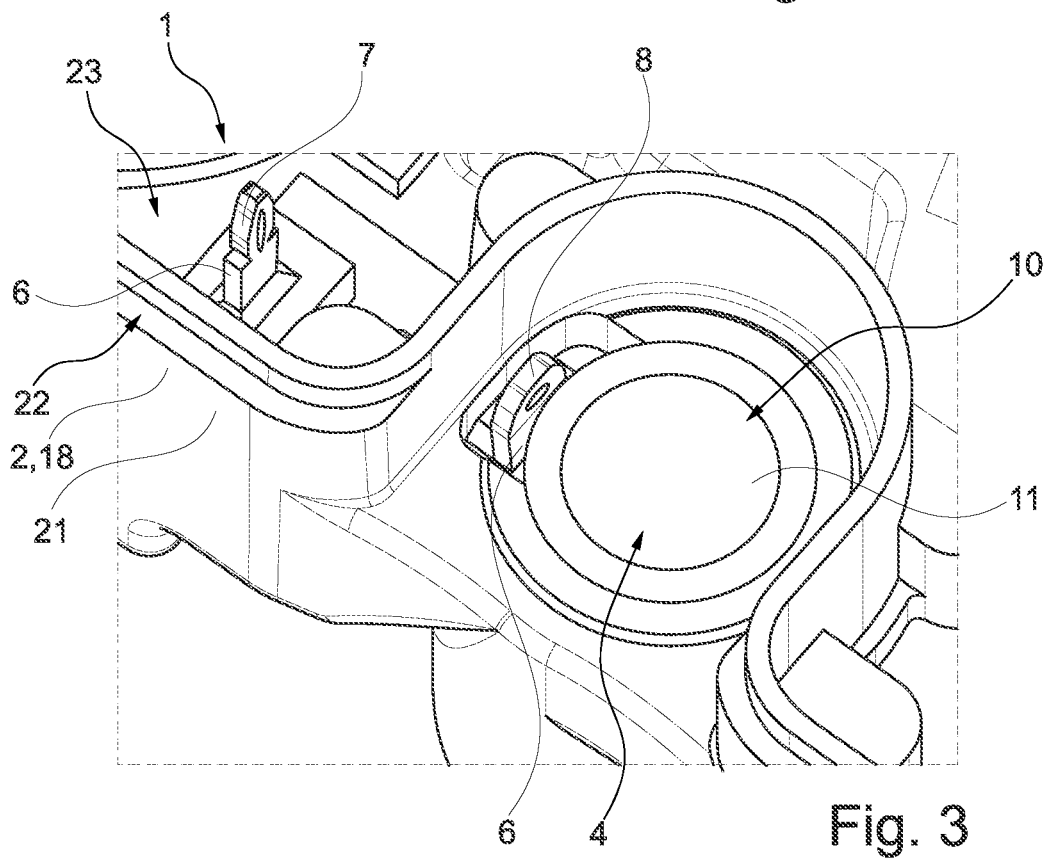
FIG. 3 shows a detailed view of the region of the bridging element indicated with "III" in FIG. 2.

In the FIGS. 2 and 3, it can be seen in more detail that the bridging element 6 is arranged in the region of a screw-receiving hole 4. The screw-receiving hole 4 is a through-hole (penetrating the housing 2) which, when mounted on the vehicle, is used to receive a mounting screw 5.

In this embodiment, the screw-receiving hole 4 is reinforced by a metallic support sleeve 11, or is formed directly by this support sleeve 11. The support sleeve 11 thus defines the axial length of the screw-receiving hole 4. The screw-receiving hole 4 is arranged outside the interior 23 as viewed with respect to the outer wall 21. Consequently, to provide the appropriate ground connection, the bridging element 6 extends from the interior 23 toward the screw-receiving hole 4/an environment 24 of the housing 2.

Figure 8:
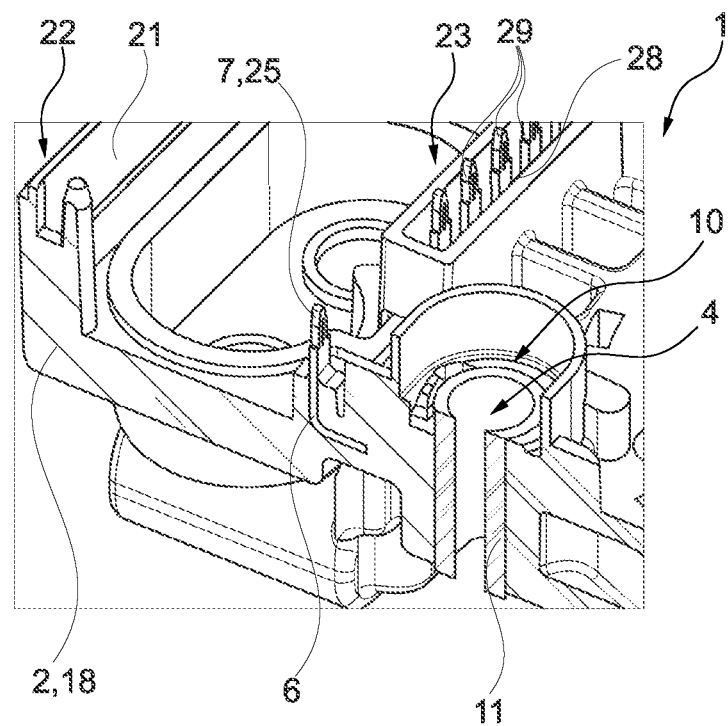
FIG. 8 shows a further perspective view of the control unit in the region of the bridging element, wherein the control unit is now sectioned in such a way that a (first) end region of the bridging element further connected to the printed circuit board can be seen.

The bridging element 6 has a first end region 7 towards its side arranged in the interior 23, which is also shown in detail in FIG. 8. This first end region 7 is designed as what is termed a press pin 25 which can be resiliently compressed in the transverse direction. This press pin 25 is inserted in a contact region 30 of the printed circuit board 14 in the mounted state in the usual manner, while implementing an electrical contact with an electronic component 3/the printed circuit board 14.

Figure 7:
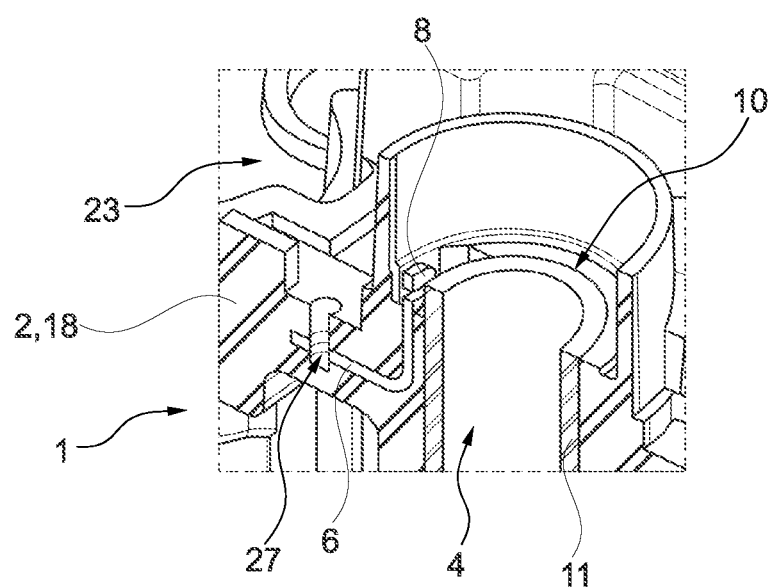
FIG. 7 shows a detailed view of the bridging element in the control unit according to FIG. 6, wherein a (second) end region of the bridging element facing the screw-receiving hole can be seen.
Figure 9:
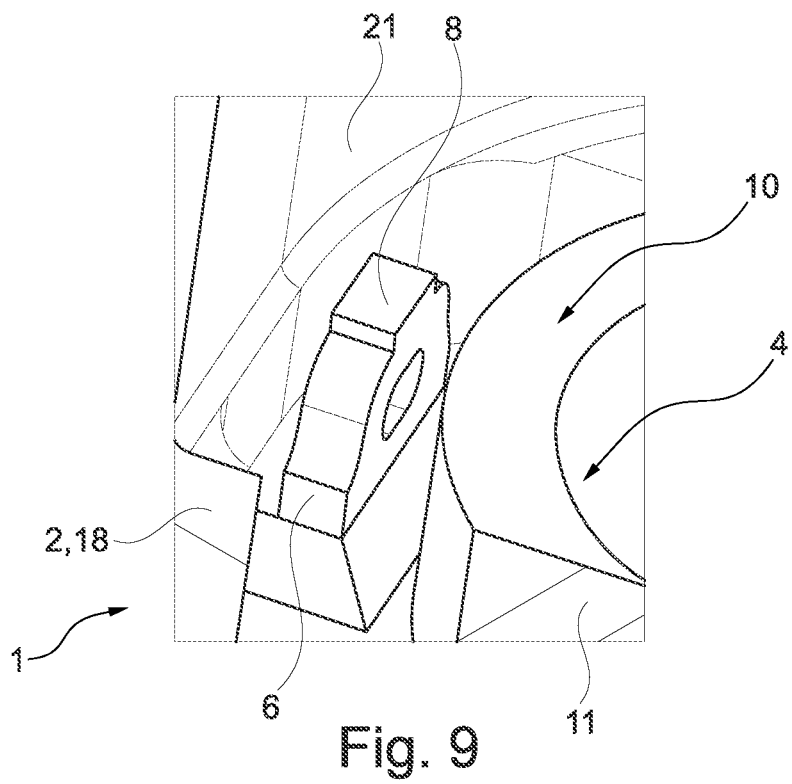
FIG. 9 shows a detailed view of the second end region of the bridging element used in the control unit.

Towards a side facing away from the first end region 7, which faces the screw-receiving hole 4, the bridging element 6 has a second end region 8 which is designed to be specifically resilient/spring-elastically flexible (FIGS. 7 and 9).

As can be seen, for example, in an overall consideration of FIGS. 3 and 9 to 11, the second end region 8 is arranged in a support region 10 for the mounting screw 5/a screw head 9 of the mounting screw 5 in such a way that, when the control unit 1 is mounted on the vehicle, the screw head 9 bears against both the support sleeve 11 and the second end region 8. For this purpose, this second end region 8 is specifically designed to be resilient in a longitudinal direction of the screw-receiving hole 4.

Figure 10:
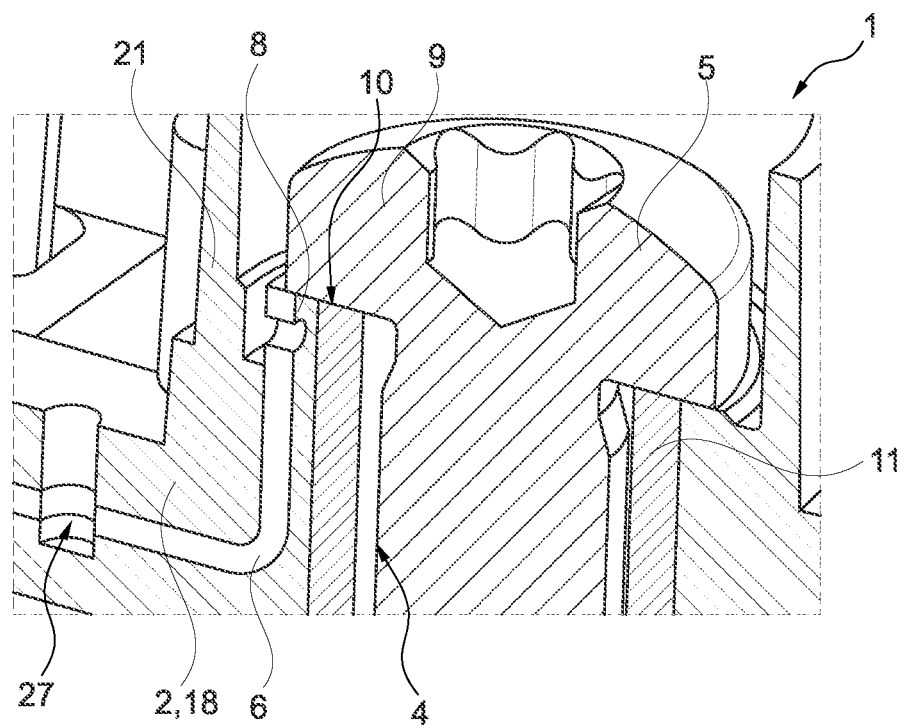
FIG. 10 shows a detailed view of the control unit, similar to FIG. 7, wherein a mounting screw is inserted into the screw-receiving hole and rests on the second end region of the bridging element.
Figure 11:
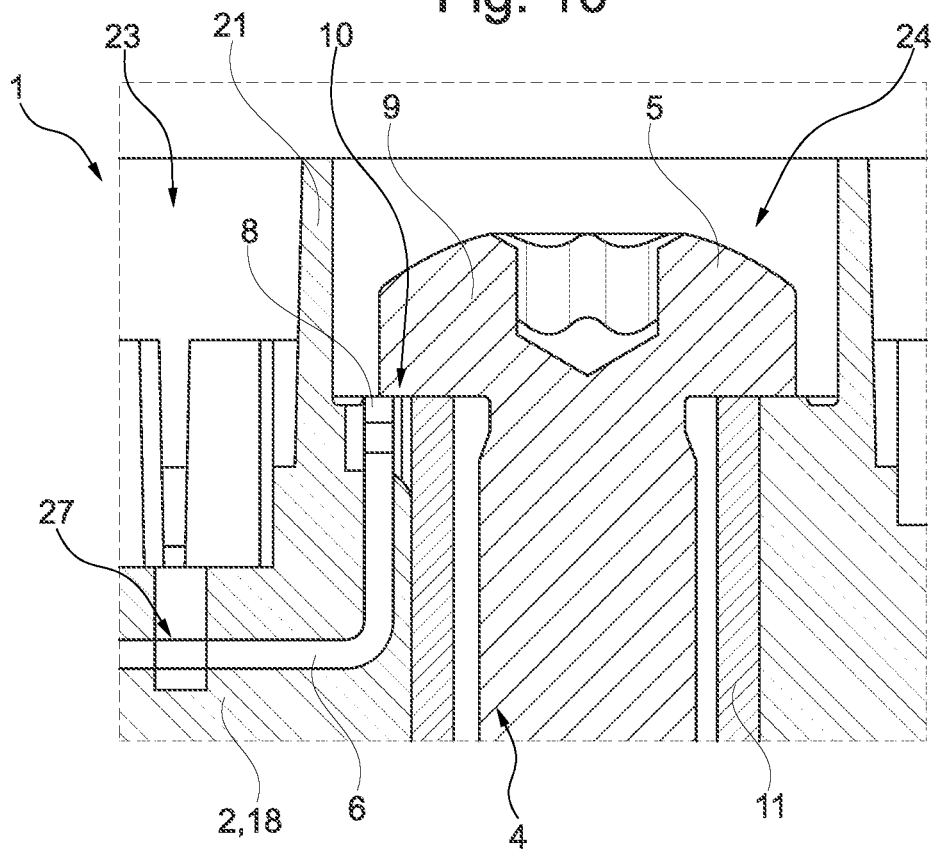
FIG. 11 shows a view of the region of the control unit shown in FIG. 10 in a sectional plane.

In FIGS. 10 and 11, it can also be seen that the elasticity of the second end region 8 is implemented in such a way that this second end region 8 is (theoretically) still resiliently flexible by a further distance/spring travel even when the screw head 9 rests on the support sleeve 11. The second end region 8 then (already compressed by a certain spring travel) bears against the screw head 9. As a result, contact with the mounting screw 5 is always ensured even if the control unit 1 is used for a longer period of time. In a state in which the mounting screw 5 does not yet bear against the support region 10, as can be seen for example in FIG. 3, i.e., in a relaxed spring state of the second end region 8, an axial end face of the second end region 8 consequently projects beyond the further support region 10 in the form of the support sleeve 11.

When mounted on the vehicle, the mounting screw 5 is screwed into a further housing not shown for the sake of clarity, e.g., a clutch housing, a transmission housing or a motor housing, and is thus electrically connected to a further vehicle ground.

Figure 12:
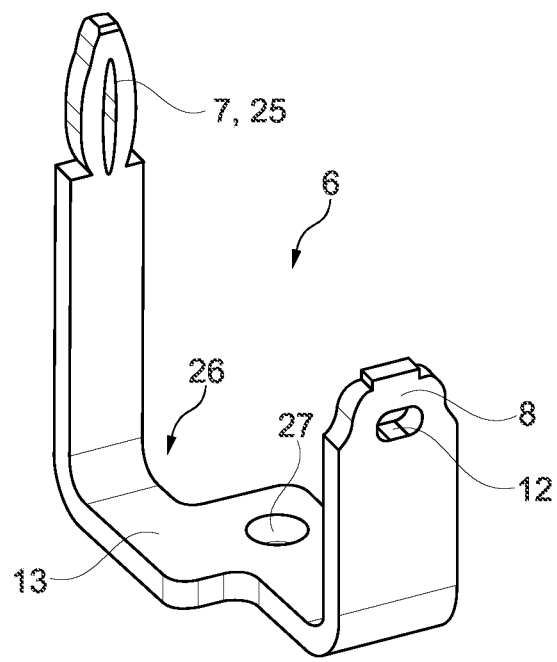
FIG. 12 shows a perspective view of the bridging element used in FIGS. 1 to 11, which is implemented according to a first variant.

Moreover, as can be seen in more detail in FIG. 12, the second end region 8 is provided with an elongated hole 12 extending transversely to the longitudinal direction of the screw-receiving hole 4, which directly enables the required spring elasticity. The bridging element 6 is formed from a metal sheet 13 of constant thickness so that the second end region 8 can be compressed as uniformly as possible in a spring-elastic manner.

Preferably, the bridging element 6 is produced by punching and has a thickness of 0.6 mm to 0.8 mm. The usual material of the bridging element 6 is CuSn6 or CuNiSi.

In FIGS. 2, 3 and 6 to 11, it can further be seen that the bridging element 6 is directly accommodated by/surrounded by the plastic material of the housing 2 in its intermediate region 26 extending between the first end region 7 and the second end region 8. This plastic material bears tightly (liquid-tight as well as further preferably also air-tight) against the bridging element 6 in the intermediate region 26, so that that gap between the bridging element 6 and the housing 2 is sealed off from the environment 24. The intermediate region 26 extends substantially U-shaped. The bridging element 6 is preferably fixed in the housing 2 directly as part of a primary forming process, i.e., an injection molding process of the housing 2.

For more precise positioning of the bridging element 6, the latter has an alignment hole 27 in that U-shaped intermediate region 26. This alignment hole 27 interacts with a mechanical fixing element as part of the production process and is held in the appropriate position. In further embodiments, it is also possible to implement the fixing element as an element remaining in the housing 2 after the primary forming process.

FIG. 2 also shows particularly well that that bridging element 6 is positioned at a distance from a connector region 28 (also referred to as a connector receiving region) having a plurality of individual contact pins 29 (arranged in a row). Thus, a ground connection is implemented as independently as possible from this connector region 28.

Figure 13:
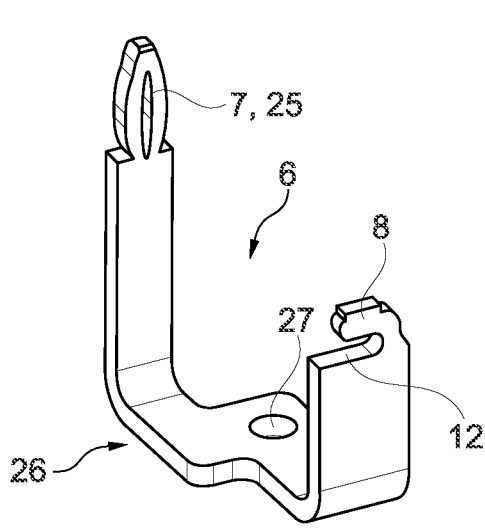
FIG. 13 shows a perspective view of the bridging element according to a second variant, in which the second end region is implemented as hook-shaped.
Figure 14:
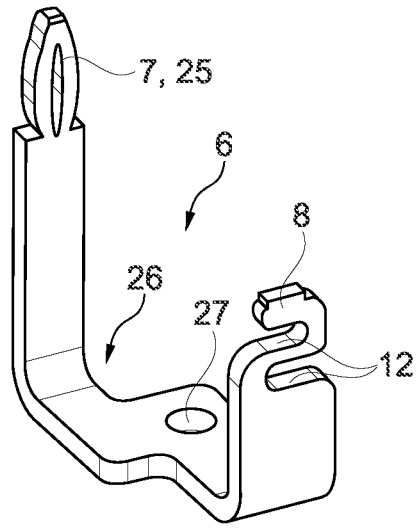
FIG. 14 shows a perspective view of the bridging element according to a third variant, in which the second end region is implemented as S-shaped.

In FIGS. 13 and 14, two further alternative embodiments of the bridging element 6 can be seen. According to FIG. 13, it can be seen that the elongated hole 12 forming the eyelet-shaped second end region 8 in FIG. 12 can also be open to one side, forming a hook shape. In FIG. 14, again as an alternative, an S-shaped region has been implemented.

In other words, the electronic module (control unit) according to the disclosure is a part of a drive unit of an actuator with BLDC motor (electric motor 16), or an independent control unit, which is spatially separated from the corresponding actuator with BLDC motor, or another electromechanical actuator assembly, which has a ground connection to a vehicle ground. This connection to the vehicle ground ensures the correct function of the actuator/control unit. In the case of a relatively small control unit with a plastic housing, as in the case of the IPL actuator, the compactness of the actuator, or the associated control unit, is of high importance. For this purpose, a contact between a PCB (printed circuit board 14) and the vehicle ground is robustly implemented.

The compact control unit is mechanically mounted on a corresponding interface in the vehicle (transmission housing, internal combustion engine, vehicle body, etc.) by means of a certain number of screw connections. Preferably, self-tapping screws (mounting screws 5) are used, which have relatively high tightening torques or can implement relatively high screw preloads.

A ground connection between the PCB (PCB incl. components, designated as control unit of the actuator) and the vehicle ground (e.g., transmission housing) is implemented by an extra pin (bridging element 6) with a press-fit zone (first end region 7). This pin is inserted at the same time as the connector pins (contact pins 29) when the housing 2 of the control unit is overmolded or, depending on the design and concept, mounted in the housing 2 together with the connector pins in a subsequent process. The pin with the press-fit zone/press-in zone is provided (ELO pin, NEO pin, etc.) at the interface of the pin/ground pin in the direction of the PCB. At this interface, the electrical contact between the pin and PCB is implemented by a certain number of gas-tight zones with a metal/metal contact. At the interface between the pin and the screw head 9 at the corresponding tightening position, the mass pin has a zone (second end region 8) with reduced mechanical stiffness in order to keep the deformation forces relatively low when tightening/ mounting the mounting screw 5 at the corresponding position, or to facilitate deformation of the pin. The pins are produced by punching and made of material with a thickness from 0.6 mm to 0.8 mm. The usual base material of the pin is CuSn6 or CuNiSi This zone with reduced mechanical stiffness is dimensioned such that after elastic-plastic deformation by the tightening process of the mounting screw 5, a residual elasticity is present so that the pin structure still guarantees the desired electrical contact between the pin and the screw head by a specified residual force under geometric tolerances. In order to avoid a possible decrease in the screw preload force over the lifetime of the application, metal sleeves (support sleeve 11) are usually used for the axial introduction of the screw preload force into the plastic housing.

In FIGS. 2 and 3, a circumferential sealing contour (receiving contour 22) can be seen in the electronics housing (housing 2). This contour constitutes the separation between the electronics space and the environment. The plastic cover (cover 19) can be attached to the plastic housing (main part 18) by means of a solid seal, liquid seal (adhesive), or by a laser welding seam. Thus, the compact control unit would be completely hermetically sealed from the environment 24. In order to ensure the appropriate tightness class of the control unit, the mass pin extends within the plastic geometry of the electronics housing (assuming an overmolding process of the pin in the plastic housing).

FIGS. 7 to 14 show the space-saving compact and cost-effective integration of the mass pin. The punched and bent pin is either overmolded or mounted in the housing 2 after overmolding, depending on the production concept and design. Shown here is the variant with an overmolded pin. If a good tightness of the electronics space in the housing 2 against the environment 24 is desired (e.g., tightness of the control unit according to class IP6K9K), it is essential to insert the mass pin in the process of overmolding the electronics housing and to fix/hold it in the tool accordingly. This means that the pin should be overmolded in this case. For this purpose, appropriate sealing interfaces must also be provided in the pin geometry at the corresponding positions in the tool. If still necessary to achieve the desired tightness class, potting cavities (recesses for potting compound) should also be provided around the sealing interfaces of the mass pin.

In FIG. 12, for example, a possible geometry of the deformable zone of the mass pin at the contact interface with the screw head 9 of the mounting screw 5 is shown in detail. This elastic zone is to be implemented in such a way that after an elastic-plastic deformation in the axial direction (direction of the axial screw preload during screwing) a residual defined contact force remains between the pin and the screw head 9. This ensures elastic contact between the PCB, the press-in zone of the pin and the mounting screw 5 of the control unit. The mounting screw 5 secures the elastic contact to the vehicle mass by screwing in of the control unit by means of this screw to a metal part in the vehicle with contact to the vehicle mass (transmission housing, internal combustion engine, vehicle body, etc.).

FIGS. 13 and 14 show geometry variants for the design of the contact zone with the screw head 9 with easier deformability/lower stiffness compared to the variant shown in FIG. 12.

In this case, the deformable zone is always implemented on the interface of the mass pin with screw contact on the width of the pin in the punching direction, so that in a zone with a higher width, the corresponding sealing interface for sealing in the overmolding tool is implemented.

LIST OF REFERENCE SYMBOLS

1 Control unit
2 Housing
3 Electronic component
4 Screw-receiving hole
5 Mounting screw
6 Bridging element
7 First end region
8 Second end region
9 Screw head
10 Support region
11 Support sleeve
12 Elongated hole
13 Metal sheet
14 Printed circuit board
15 Drive module
16 Electric motor
17 Actuator
18 Main part
19 Cover
20 Spindle drive
21 Outer wall
22 Receiving contour
23 Interior
24 Environment
25 Press pin
26 Intermediate region
27 Alignment hole
28 Connector region
29 Contact pin
30 Contact region

The invention claimed is:

1. A control unit for a motor vehicle, the control unit comprising:
a housing;
at least one electronic component accommodated in the housing;
at least one screw-receiving hole provided in the housing and a mounting screw that is received in the at least one screw-receiving hole;
a bridging element consisting of metal and used for a ground connection of the at least one electronic component, the bridging element having a first end region which is located inside the housing and is electrically connected to the electronic component, and a second end region which is resiliently deformable along the screw-receiving hole is arranged in a support region configured for axial support of a screw head of the mounting screw.

2. The control unit according to claim 1, wherein the bridging element is fixed in the housing by at least one of injection molding or a mechanical fixing element.

3. The control unit according to claim 1, wherein the screw-receiving hole is formed by a metallic support sleeve fixedly accommodated in the housing and the bridging element is arranged such that the second end region projects axially beyond the support sleeve.

4. The control unit according to claim 1, wherein the second end region is provided with an elongated hole extending transversely to a longitudinal direction of the screw-receiving hole.

5. The control unit according to claim 1, wherein the second end region is eye-shaped, hook-shaped or S-shaped.

6. The control unit according to claim 1, wherein the bridging element is formed from a metal sheet having a uniform sheet thickness.

7. The control unit according to claim 1, wherein the electronic component comprises a printed circuit board or is arranged on the printed circuit board.

8. A drive module for a parking lock actuation of a motor vehicle, comprising the control unit according to claim 1 and an electric motor connected to the control unit.

9. The drive module according to claim 8, wherein the electric motor and the control unit are located in the housing which is a common housing.

10. A control unit for a motor vehicle, the control unit comprising:
a housing;
at least one electronic component accommodated in the housing;
at least one screw-receiving hole provided in the housing and a mounting screw that is received in the at least one screw-receiving hole;
a bridging element comprised of metal and forming a ground connection of the at least one electronic component, the bridging element having a first end region which is located inside the housing and is electrically connected to the electronic component, and a second end region which is resiliently deformable arranged in a support region configured for axial support of a screw head of the mounting screw.

11. The control unit according to claim 10, wherein the bridging element is fixed in the housing by at least one of injection molding or a mechanical fixing element.

12. The control unit according to claim 10, wherein the screw-receiving hole is formed by a metallic support sleeve fixedly accommodated in the housing and the bridging element is arranged such that the second end region projects axially beyond the support sleeve.

13. The control unit according to claim 10, wherein the second end region comprises an elongated hole extending transversely to a longitudinal direction of the screw-receiving hole.

14. The control unit according to claim 10, wherein the second end region is eye-shaped, hook-shaped or S-shaped.

15. The control unit according to claim 10, wherein the bridging element is formed from a metal sheet having a uniform sheet thickness.

16. The control unit according to claim 10, wherein the second end region is configured to be further resiliently compressed when the screw head is supported in a planar manner on the support region.

17. The control unit according to claim 10, wherein the electronic component comprises a printed circuit board or is arranged on the printed circuit board.

18. A control unit for a motor vehicle, the control unit comprising:
   a housing;
   at least one electronic component accommodated in the housing;
   at least one screw-receiving hole provided in the housing and a mounting screw that is received in the at least one screw-receiving hole; and
   a bridging element consisting of metal and used for a ground connection of the at least one electronic component, the bridging element having a first end region which is located inside the housing and is electrically connected to the electronic component, and a second end region which is resiliently deformable along the screw-receiving hole is arranged in a support region configured for axial support of a screw head of the mounting screw;
   wherein the second end region is configured to be further resiliently compressed when the screw head is supported in a planar manner on the support region.

* * * * *